(12) United States Patent
Campbell

(10) Patent No.: US 9,118,006 B1
(45) Date of Patent: Aug. 25, 2015

(54) CARBON-CHALCOGENIDE VARIABLE RESISTANCE MEMORY DEVICE

(71) Applicant: Boise State University, Boise, ID (US)

(72) Inventor: Kristy A. Campbell, Boise, ID (US)

(73) Assignee: Boise State University, Boise, ID (US)

( * ) Notice: Subject to any disclaimer, the term of this patent is extended or adjusted under 35 U.S.C. 154(b) by 0 days.

(21) Appl. No.: 14/457,400

(22) Filed: Aug. 12, 2014

(51) Int. Cl.
*H01L 45/00* (2006.01)

(52) U.S. Cl.
CPC .......... *H01L 45/143* (2013.01); *H01L 45/1233* (2013.01); *H01L 45/1253* (2013.01); *H01L 45/149* (2013.01); *H01L 45/1625* (2013.01)

(58) Field of Classification Search
CPC .. H01L 45/143; H01L 45/149; H01L 45/1625
USPC .................. 438/131, 132, 382; 257/529, 537
See application file for complete search history.

(56) References Cited

U.S. PATENT DOCUMENTS

| | | | |
|---|---|---|---|
| 6,348,365 B1 | 2/2002 | Moore et al. | |
| 6,487,106 B1 | 11/2002 | Kozicki | |
| 7,087,919 B2 | 8/2006 | Campbell et al. | |
| 7,304,368 B2 | 12/2007 | Campbell | |
| 2003/0068861 A1* | 4/2003 | Li et al. | 438/257 |
| 2008/0075844 A1* | 3/2008 | Ha et al. | 427/126.1 |
| 2009/0179187 A1* | 7/2009 | Liu et al. | 257/4 |
| 2011/0147692 A1* | 6/2011 | Park et al. | 257/2 |
| 2015/0106554 A1* | 4/2015 | Balakrishnan | 711/103 |
| 2015/0179931 A1* | 6/2015 | Liu et al. | |

OTHER PUBLICATIONS

Ghezzi et al. Effect of Carbon Doping on the Structure of Amorphous GeTe Phase Change Material; 2011 American Institue of Physics Oct. 11, 2011.
Julien Vitello; Creating Phase-Change Memory Devices With GeTe Thin Films; Nov. 2011 Solid State Technology Nov. 1, 2011.
Zhou et al. Carbon-doped Ge2Sb2Te5 phase change material: A candidate for high-density phase change memory application; 2012 American Institute of Physics; Applied Physics Letters 101, 142104 Oct. 2, 2012.

* cited by examiner

*Primary Examiner* — George Fourson, III
(74) *Attorney, Agent, or Firm* — Parsons Behle & Latimer

(57) ABSTRACT

A variable resistance memory device that includes a first electrode, a second electrode, and a first chalcogenide material layer between the first and second electrodes, the chalcogenide layer including carbon incorporated into germanium selenide chalcogenide glass. The variable resistance memory device may include a second chalcogenide material layer between the first chalcogenide material layer and the second electrode. The variable resistance memory device may include a first metallic layer between the second chalcogenide material layer and the second electrode. The variable resistance memory device may include a third chalcogenide material layer between the first metallic layer and the second electrode. The variable resistance memory device may include a fourth chalcogenide material layer between the first chalcogenide material layer and the first electrode. The first chalcogenide layer may be formed by co-sputtering carbon with $Ge_{40}Se_{60}$.

26 Claims, 7 Drawing Sheets

CARBON-CHALCOGENIDE VARIABLE RESISTANCE MEMORY DEVICE

FIELD OF THE DISCLOSURE

This disclosure relates generally to continuously variable resistance memory devices, also referred to herein as a memristor. In particular, the disclosure relates to improvements in memristors including, among other things, the ability to program the device to a lower resistance and the ability to tune the device during an erase operation in the higher resistance direction.

BACKGROUND

Variable resistance memory devices, also known as resistance variable memory elements, utilizing chalcogenides have been used as semi-volatile and non-volatile random access memory devices. U.S. Pat. No. 6,348,365 entitled "PCRAM Cell Manufacturing" discloses a typical chalcogenide variable resistance memory element. A typical chalcogenide variable resistance memory element often incorporates a conductive material into a chalcogenide glass. The conductive material may typically be silver and/or copper. The resistance of the chalcogenide glass can be "programmed" to have two logic states, a high resistant state and a low resistant state. The memory element may be in the low resistant state during a write operation and in the high resistant state during a read operation. In operation, a voltage potential may be applied across the chalcogenide glass to "program" the memory element to the low resistant state permitting a write operation to the memory element. A voltage potential having a lesser magnitude may then be applied to the memory element to permit a read operation on the device. A chalcogenide variable resistance memory element can function as a semi- or non-volatile variable resistance memory having at least two resistance states.

The low resistance state of a chalcogenide variable resistance memory element may remain intact for days or weeks after the voltage potentials are removed from the device. Such material can be returned to its high resistance state by applying a reverse voltage potential between the electrodes of at least the same order of magnitude as used to write the element to the low resistance state. Again, the highly resistive state of the device may be maintained once the voltage potential is removed. This way, such a device can function, for example, as a variable resistance memory element having two resistance states, which can define two logic states.

One preferred variable resistance material comprises a chalcogenide glass. A specific example is germanium-selenide ($Ge_xSe_{100-x}$) comprising silver (Ag). One method of providing silver to the germanium-selenide composition is to initially form a germanium-selenide glass and then deposit a thin layer of silver upon the glass, for example by sputtering, physical vapor deposition, or other known techniques in the art. The layer of silver is irradiated, preferably with electromagnetic energy at a wavelength less than 600 nanometers, so that the energy passes through the silver and to the silver/glass interface, to break a chalcogenide bond of the chalcogenide material such that the glass is doped or photodoped with silver. Silver may also be provided to the glass by processing the glass with silver, as in the case of a silver-germanium-selenide glass co-sputtered with Ag. Another method for providing metal to the glass is to provide a layer of silver-selenide on a germanium-selenide glass.

U.S. Pat. No. 7,304,368 discloses a variable resistance device that has various layers including a chalcogenide glass layer and a tin-chalcogenide layer between two electrodes. Upon the application of a potential across the variable resistance device, it is believed that tin from the tin-chalcogenide layer may be incorporated into the chalcogenide glass layer to form a conductive channel through the chalcogenide glass layer, which causes a detectible resistance change across the device. Variable resistance devices, such as the device disclosed in U.S. Pat. No. 7,304,368, which is hereby incorporated by reference, may be difficult to tune in the high resistance programming range, and preferentially operate in a binary mode between high and low resistances. Other drawbacks of current devices may also exist.

Accordingly, there is also a need for variable resistance device that is easier to tune in the high resistance programming range, and for variable resistance memory devices that are stable and repeatable in operation, and resistant to silver migration during thermal stresses such as those present in higher temperature device operation and in some back-end-of-line processes (as long as the temperature remains below the chalcogenide glass transition temperature).

SUMMARY

Accordingly, the present disclosure sets forth a continuously variable resistance memory device that substantially solves, reduces, or eliminates the above-noted drawbacks of existing devices.

One embodiment of a variable resistance memory device comprises a first electrode, a second electrode, and a first chalcogenide material layer between the first and second electrodes, the chalcogenide layer comprising carbon incorporated into germanium selenide chalcogenide glass. The device includes a second chalcogenide material layer between the first chalcogenide material layer and the second electrode. The device includes a first metallic layer between the second chalcogenide material layer and the second electrode. The device includes a third chalcogenide material layer between the first metallic layer and the second electrode.

The device may include a fourth chalcogenide material layer between the first chalcogenide material layer and the first electrode. The first chalcogenide material layer may comprise $(Ge_{40}Se_{60})_{(1-x)}C_x$. The first chalcogenide material layer may have a range of 0.1 to 0.5 for x. The first chalcogenide material layer may be carbon co-sputtered with $Ge_{40}Se_{60}$. The device may include a second metallic layer between the first chalcogenide material layer and the second chalcogenide material layer. The device may include a fourth chalcogenide material layer between the first chalcogenide material layer and the first electrode.

The second metallic layer may be tin selenide. The second metallic layer may have a thickness ranging between approximately 500 angstroms and 1000 angstroms. The second electrode may be a layer of tungsten. The first metallic layer may be silver. The first chalcogenide material layer may have a thickness between approximately 100 and 800 angstroms. The second metallic layer may have a thickness between approximately 500 and 1000 angstroms. The second chalcogenide material layer may have a thickness between approximately 100 and 150 angstroms. The first metallic layer may have a thickness between approximately 500 and 800 angstroms. The third chalcogenide material layer may have a thickness between approximately 100 and 150 angstroms. The second electrode may have a thickness between approximately 350 and 400 angstroms.

One embodiment is a method of forming a variable resistance memory device comprising forming a first electrode, forming a second electrode, and forming a first chalcogenide material layer between the first and second electrodes, the chalcogenide layer comprising carbon incorporated into germanium selenide chalcogenide glass. The method includes forming a second chalcogenide material layer between the first chalcogenide material layer and the second electrode, forming a first metallic layer between the second chalcogenide material layer and the second electrode, and forming a third chalcogenide material layer between the first metallic layer and the second electrode.

The method may include forming a second metallic layer between the first chalcogenide material layer and the second chalcogenide material layer. The first metallic layer may be silver and the second metallic layer may be tin selenide. Forming the first chalcogenide material layer may further comprise co-sputtering carbon and $Ge_{40}Se_{60}$ to form the first chalcogenide material layer. The co-sputtering may be done with a power of 50 watts.

One embodiment is a method of forming a variable resistance memory device comprising forming a first electrode on a substrate, forming a chalcogenide stack on the first electrode, and forming a second electrode on the chalcogenide stack with the chalcogenide stack comprising a layer of carbon incorporated into germanium selenide chalcogenide glass. The method may include forming an insulating layer adjacent to the first electrode. The insulating layer may be silicon nitride. The method may include co-sputtering carbon with $Ge_{40}Se_{60}$ to form the layer of carbon incorporated into germanium selenide chalcogenide glass of the chalcogenide stack. The carbon and $Ge_{40}Se_{60}$ may be co-sputtered using a power of 50 watts.

One embodiment is a variable resistance memory device comprising a first electrode, a second electrode, a first chalcogenide material layer between the first and second electrodes, the chalcogenide layer comprising carbon incorporated into germanium selenide chalcogenide glass, and a first metallic layer between the first chalcogenide material layer and the second electrode. The device may include a second metallic layer between the first chalcogenide material layer and the first metallic layer. The device may include a second chalcogenide material layer between the first chalcogenide material layer and the first electrode. The device may include a second metallic layer between the first chalcogenide material layer and the first metallic layer.

BRIEF DESCRIPTION OF THE DRAWINGS

These and other features and advantages of the present application will be better understood from the following detailed description, which is provided in connection with the accompanying drawings.

Figure 1:
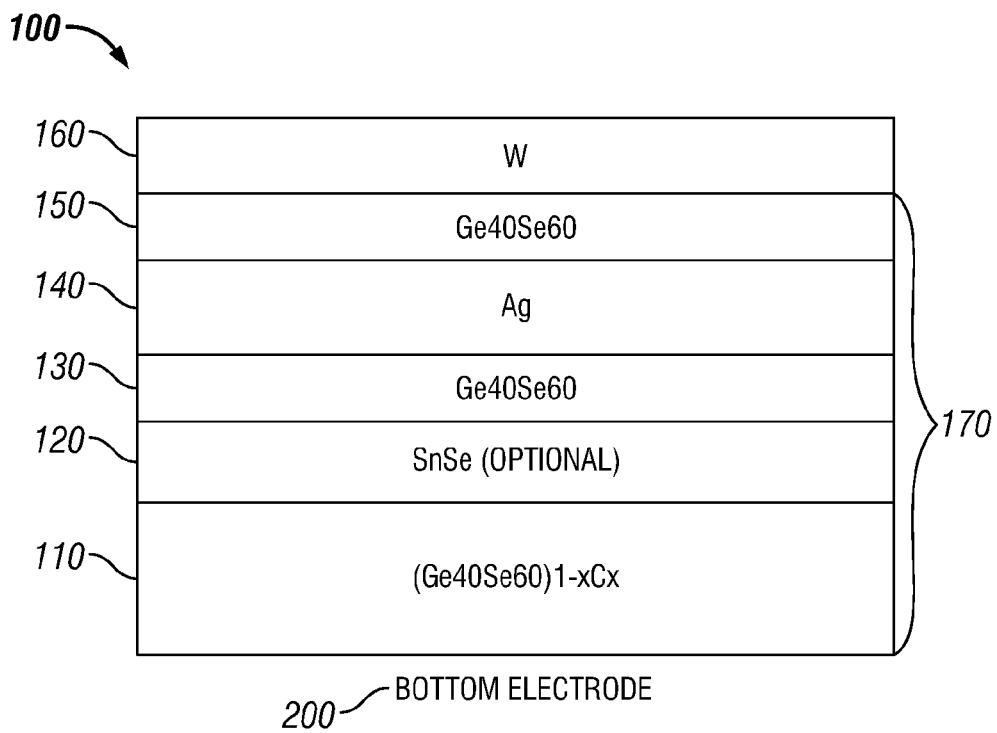
FIG. 1 illustrates one embodiment of a memristor film stack with a carbide active layer.

While the disclosure is susceptible to various modifications and alternative forms, specific embodiments have been shown by way of example in the drawings and will be described in detail herein. However, it should be understood that the disclosure is not intended to be limited to the particular forms disclosed. Rather, the intention is to cover all modifications, equivalents and alternatives falling within the spirit and scope of the invention as defined by the appended claims.

DETAILED DESCRIPTION

In the following detailed description, reference is made to various specific embodiments of the application. These embodiments are described with sufficient detail to enable those skilled in the art to practice the invention. It is to be understood that other embodiments may be employed, and that various structural, logical and electrical changes may be made without departing from the spirit or scope of the invention.

The term "substrate" used in the following description may include any supporting structure including but not limited to a semiconductor substrate that has an exposed substrate surface. A semiconductor substrate should be understood to include silicon-on-insulator (SOI), silicon-on-sapphire (SOS), doped and undoped semiconductors, epitaxial layers of silicon supported by a base semiconductor foundation, and other semiconductor structures. When reference is made to a semiconductor substrate or wafer in the following description, previous process steps may have been utilized to form regions or junctions in or over the base semiconductor or foundation.

The term "silver" is intended to include not only elemental silver, but silver with other trace metals or in various alloyed combinations with other metals as known in the semiconductor industry, as long as such silver alloy is conductive, and as long as the physical and electrical properties of the silver remain unchanged.

The term "silver-selenide" is intended to include various species of silver-selenide, including some species which have a slight excess or deficit of silver, for instance, $Ag_2Se$, $Ag_{2+x}Se$, and $Ag_{2-x}Se$.

The term "semi-volatile memory" is intended to include any memory device or element which is capable of maintaining its memory state after power is removed from the device for a prolonged period of time. Thus, semi-volatile memory devices are capable of retaining stored data after the power source is disconnected or removed. Accordingly, the term "semi-volatile memory" is also intended to include not only semi-volatile memory devices, but also non-volatile memory devices.

The term "resistance variable material" is intended to include chalcogenide glasses, and chalcogenide glasses comprising a metal, such as silver. For instance the term "variable resistance material" includes silver doped chalcogenide glasses, silver-germanium-selenide glasses, and chalcogenide glass comprising a silver selenide layer. The term memristor generally relates to a continuously variable resistance device.

The term "variable resistance memory element" is intended to include any memory element, including programmable conductor memory elements, semi-volatile memory elements, and non-volatile memory elements which exhibit a resistance change in response to an applied voltage.

The term "chalcogenide glass" is intended to include glasses that comprise an element from group VIA (or group 16) of the periodic table. Group VIA elements, also referred to as chalcogens, include sulfur (S), selenium (Se), tellurium (Te), polonium (Po), and oxygen (O).

FIGS. 1-9 illustrate exemplary embodiments of a memristor device 100 in accordance with the present application. It should be understood that the memristor device can be formed on a variety of substrate materials and not just semiconductor substrates such as silicon. For example, a memristor device may be formed on a plastic substrate. The memristor device may also include one or more insulating layers that may be formed by any known deposition methods, such as sputtering by chemical vapor deposition (CVD), plasma enhanced CVD (PECVD) or physical vapor deposition (PVD). Likewise, one or more insulating layers may be formed of a conventional insulating oxide, such as silicon oxide ($SiO_2$), a silicon nitride ($Si_3N_4$), or a low dielectric constant material, among many others.

FIG. 1 illustrates one example of a memristor device 100 with a first chalcogenide layer that is incorporated with carbon 110. In the illustrated example, the first chalcogenide layer 110 of the memristor device may have a thickness within the range of about 100 angstroms (Å) to about 800 Å. The first chalcogenide layer 110 may comprise $(Ge_{40}Se_{60})_{(1-x)}C_x$. In some embodiments it may be desirable to have an x value in the range of $0.1 \leq x \leq 0.5$. The addition of carbon to the chalcogenide layers permits the tuning of the resistance of the memristor device 100. Carbon is usually considered an impurity in the semiconductor manufacturing industry and is thus not incorporated into prior continuously variable resistance devices.

As also shown, embodiments, the first chalcogenide layer 110 of the memristor device 100 may be formed on a bottom electrode layer 200. In some embodiments bottom electrode layer 200 may comprise a silver layer. Other layers are also possible. In some embodiments bottom electrode layer 200 may be formed on a substrate layer (not shown in FIG. 1).

Some embodiments of memristor device 100 further comprise an optional metal selenide layer 120. For example, some embodiments may comprise an optional metal selenide layer 120 of tin selenide (SnSe) and having a thickness within the range of about 500 Å to about 1000 Å. A SnSe layer 120 may provide certain advantages, such as impeding Ag diffusion into the first chalcogenide layer 110 during thermal stressing.

Some embodiments of the memristor device 100 further comprise a second chalcogenide layer 130. For example, in some embodiments, the second chalcogenide layer 130 may comprise $Ge_{40}Se_{60}$ and have a thickness within the range of about 100 Å to about 150 Å. Other embodiments are also possible Embodiments of the memristor device 100 further comprises a second metallic layer 140, which provides a source of mobile ions. In some embodiments, the second metallic layer 140 may comprise silver (Ag) and may have a thickness within the range of about 500 Å to about 800 Å. In some embodiments, the second metallic layer 140 may comprise copper (Cu). The second metallic layer 140 may be deposited by any technique known in the art.

Some embodiments of the memristor device 100 may further comprise a third chalcogenide layer 150. For example, embodiments of the third chalcogenide layer 150 may comprise $Ge_{40}Se_{60}$ and have a thickness within the range of about 100 Å to about 150 Å. Generally, layers 110 through 150 may be referred to as the chalcogenide stack 170.

Finally, some embodiments of the memristor device 100 further comprise a top electrode layer 160. The top electrode layer 160 may comprise any suitable electrode material (e.g., tungsten) and may have a thickness within the range of about 350 Å to about 400 Å.

In general, memristor devices 100 are typically measured under pulsed conditions since DC (quasi-static) sweeps do not provide true operational information (unless the device will be used in a circuit in a similar manner to the conditions of a DC sweep). Pulsed measurements are best performed in a circuit similar to that which will use the device.

Figure 2:
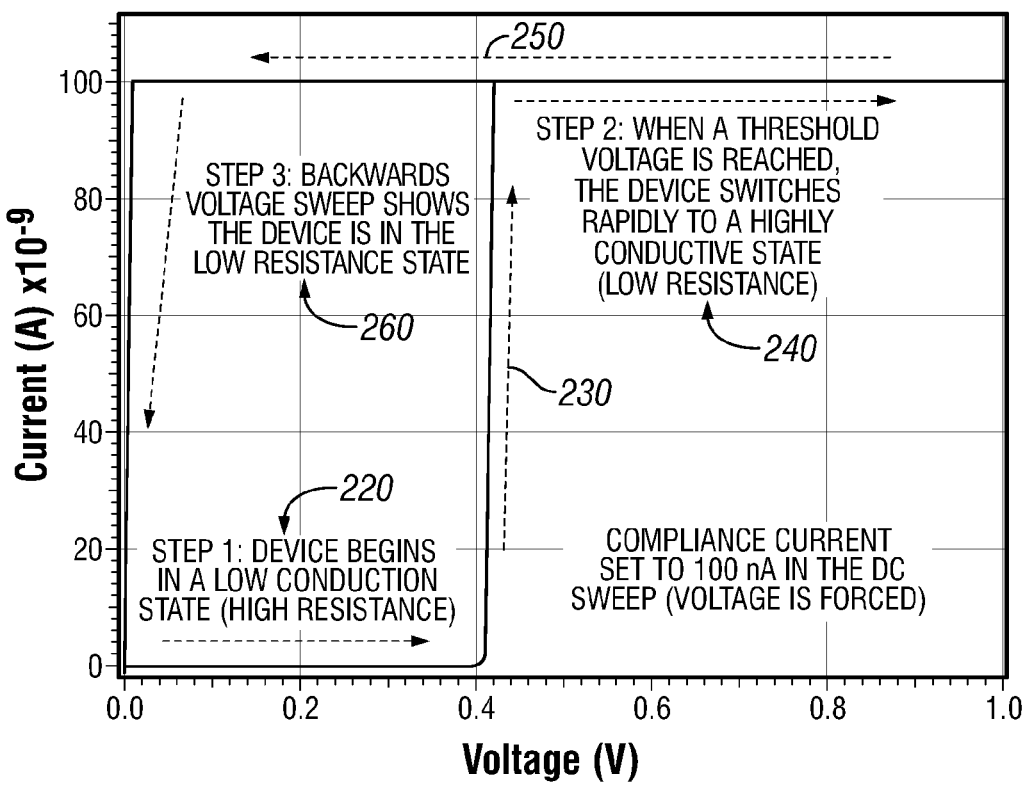
FIG. 2 illustrates one example of a DC voltage sweep of a memristor device.

FIG. 2 illustrates one example of an exemplary DC voltage sweep of some embodiments of a memristor device 100. In the illustrated example, the data may be collected using a suitable semiconductor device parameter analyzer, such as the B1500 analyzer marketed by Agilent Technologies, Inc. of Santa Clara, Calif. In some cases, the compliance current is set to 100 nA in the DC sweep, and the voltage is forced.

As shown in FIG. 2, in exemplary first step 220, the memristor device 100 begins in a low conduction state (i.e., high resistance). As indicated at 230, a transition may occur in some embodiments when a threshold voltage is reached. For the exemplary embodiment shown in FIG. 2, the threshold is approximately 0.4 V. As shown, at the transition 230 the memristor device 100 switches rapidly to a highly conductive state (i.e., low resistance) and reaches the compliance current set on the instrument, 100 nA in this case.

As also indicated at 250 in FIG. 2, when the voltage sweep is reversed, embodiments of the memristor device 100 may exhibit hysteresis in that as the voltage passes the first threshold value indicated at 230 and the memristor device 100 remains in a low resistance state (i.e., high conductivity) past the first voltage threshold (at 230) until, as indicated at 260 the reverse transition back to a low conductivity (i.e., high resistance) state occurs. For the embodiment shown in FIG. 2, the reverse transition at 260 occurs at approximately 10 mV.

Figure 3:
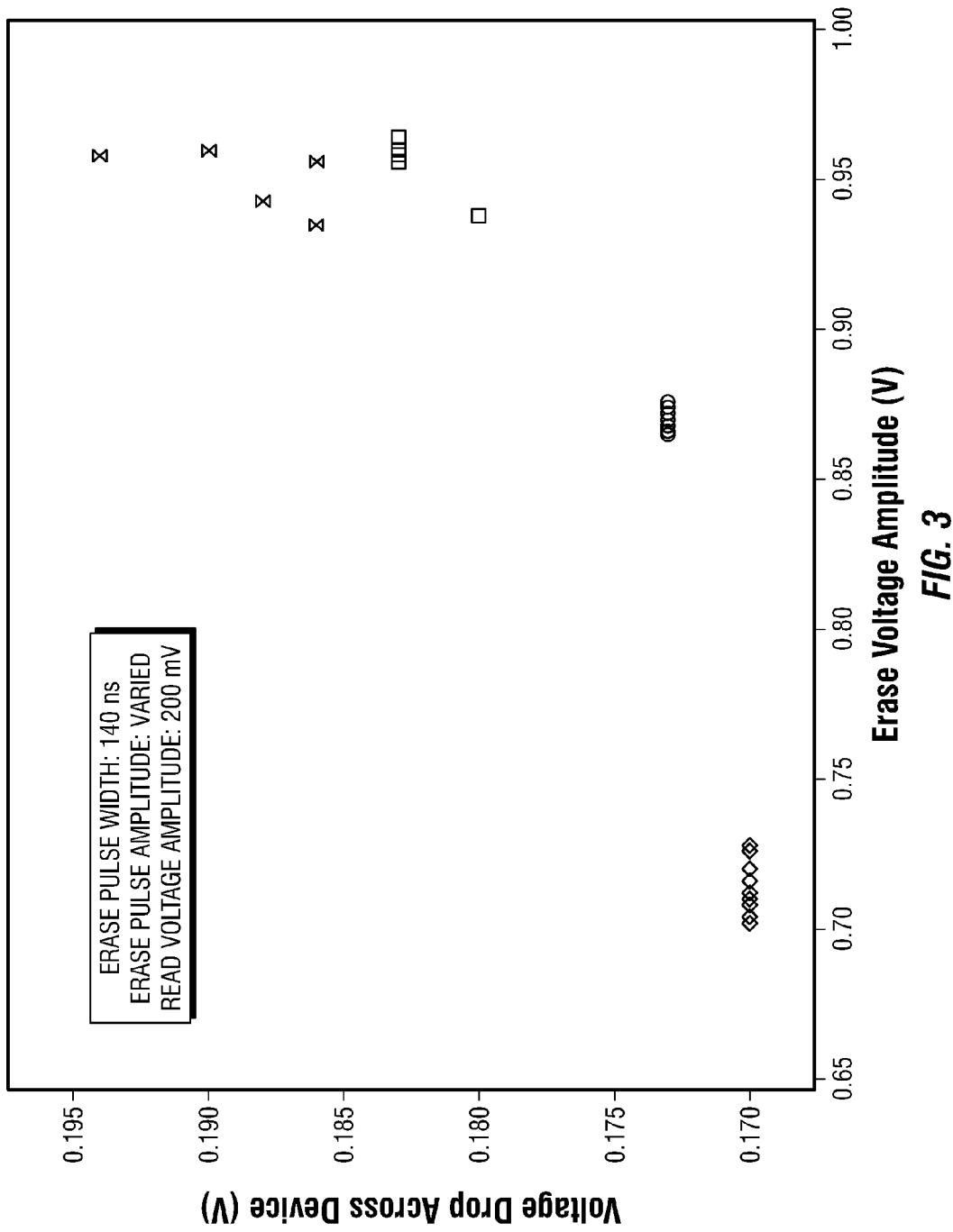
FIG. 3 illustrates the results of electrically tuning the erased state resistance using pulse testing.

The chart illustrated in FIG. 3 shows the voltage drop across the memristor device during the erase process with varying erase pulse amplitudes. Each point on the chart represents a separate measurement. The erase pulse amplitude will increase when trying to erase the memristor device to a higher resistance. As the erase pulse amplitude increases, the voltage drop across the memristor device increases, which corresponds to the increased resistance. The incorporation of carbon into the first chalcogenide layer of a memristor device may permit the device to be tuned during an erase operation in the higher resistance direction.

For the embodiments shown in FIG. 3, the memristor material was deposited via co-sputtering with a carbon and a $Ge_{40}Se_{60}$ target. The co-sputtering allows a certain percentage of carbon to be incorporated into the $Ge_{40}Se_{60}$ film. The percentage may be controlled by the power used to sputter the carbon target. For the embodiments shown in FIG. 3, a power of 50 W to was used to sputter the carbon film. The $Ge_{40}Se_{60}$ target was sputtered with 35 W power. The tool used was an AJA International sputter tool, but other tools, power levels, and methods of sputtering may be implemented as would be appreciated by one of ordinary skill in the art having the benefit of this disclosure.

Figure 4:
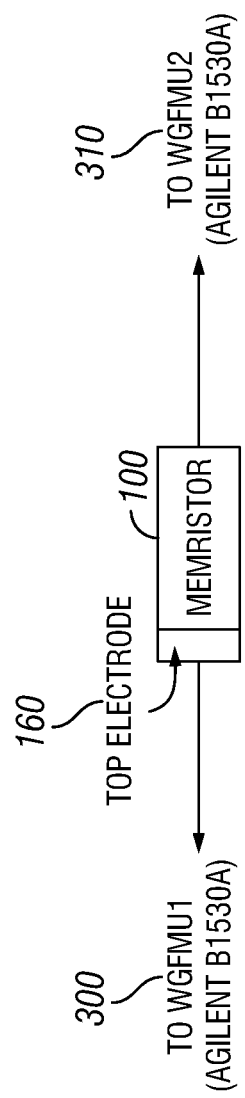
FIG. 4 illustrates one example of a measurement setup for pulsed testing of a memristor device.

FIG. 4 illustrates one example of a measurement setup for pulsed testing of a memristor device 100. In the illustrated example, the data are collected using two suitable Waveform Generator/Fast Measurement Units (WGFMUs), such as the B1500A and the B1530A WGFMUs marketed by Agilent Technologies, Inc. of Santa Clara, Calif. This is indicated in FIG. 4 at 300 and 310 which represent the connection points to the WGFMUs. As also indicated in FIG. 4, memristor device 100 may be connected to one WGFMU (e.g., 300)

through the top electrode 160 and to the other WGFMU (e.g., 310) through the bottom electrode 200 (not shown in FIG. 4).

In some embodiments, the WGFMUs 300 and 310 are operated in PG mode with 5V max range when measuring voltage across the device during pulsing. Likewise, fast IV mode is used to measure current through the device during pulsing. One drawback of this measurement is the lack of current limiting. The memristor devices 100 can be forced into very low resistance states (e.g., about 50 to 100 Ohms) and the measured current through the memristor 100 device can be in the mA range. The above example is not indicative of how embodiments of the memristor device 100 must be operated, but does show that it can be operated at very low resistance, if desired.

Figure 5:
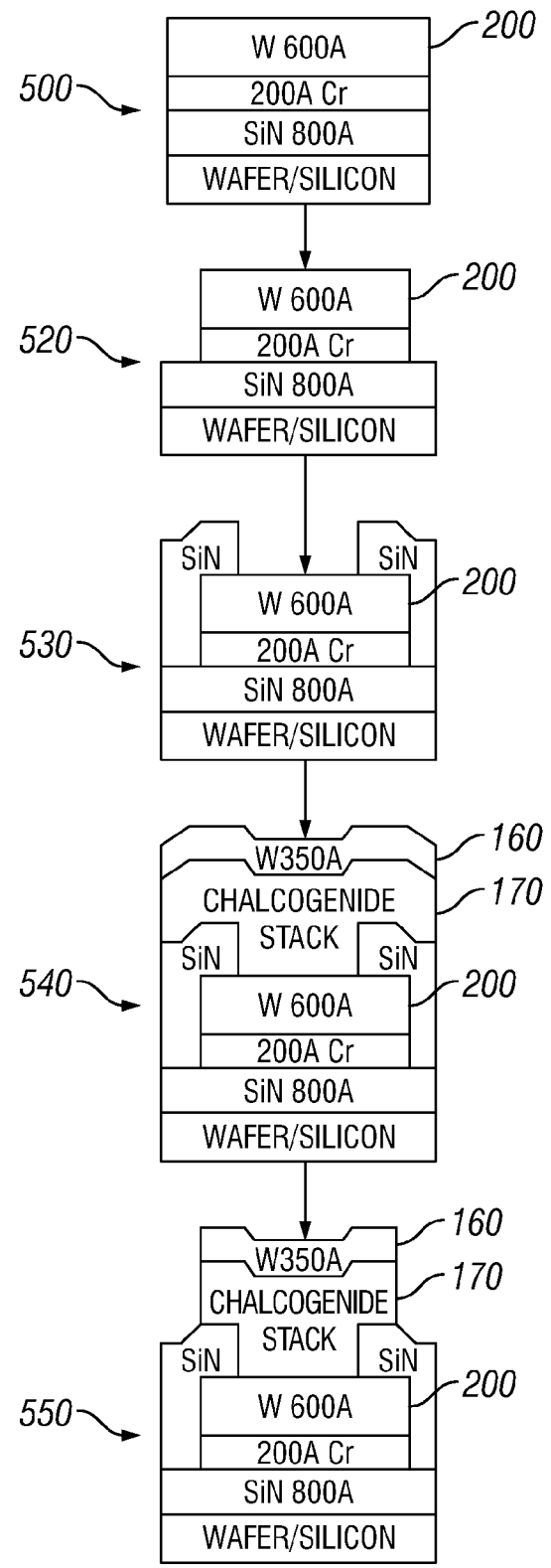
FIG. 5 illustrates one example of a fabrication process for some embodiments of a memristor device.

FIG. 5 is an illustration of an example of a fabrication process for a memristor device 100 in accordance with some embodiments. As shown in FIG. 5, the initial fabrication process may begin at 500 with a typical substrate wafer having a top layer that will become the bottom electrode 200 of the memristor device 100. At 520 the bottom electrode 200 and certain layers of the substrate have been etched to define the desired bottom electrode 200 shape and dimension.

As indicated at 530, for some embodiments, one or more insulating layers may be formed of a conventional insulating oxide, such as silicon oxide ($SiO_2$), a silicon nitride ($Si_3N_4$), or a low dielectric constant material, among many others. As also indicated, a portion of the insulating oxide may be removed, or left off, to expose the bottom electrode 200.

As indicated at 540, the chalcogenide stack 170 and top electrode layer 160 may be formed on the bottom electrode 200 as described herein. At 550 some embodiments may receive a final etch or removal of material in layers 160 and 170 to define the shape, dimension, or other characteristics of the memristor device 100. Other fabrication processes may also be implemented to fabricate the memristor device 100.

Figure 6:
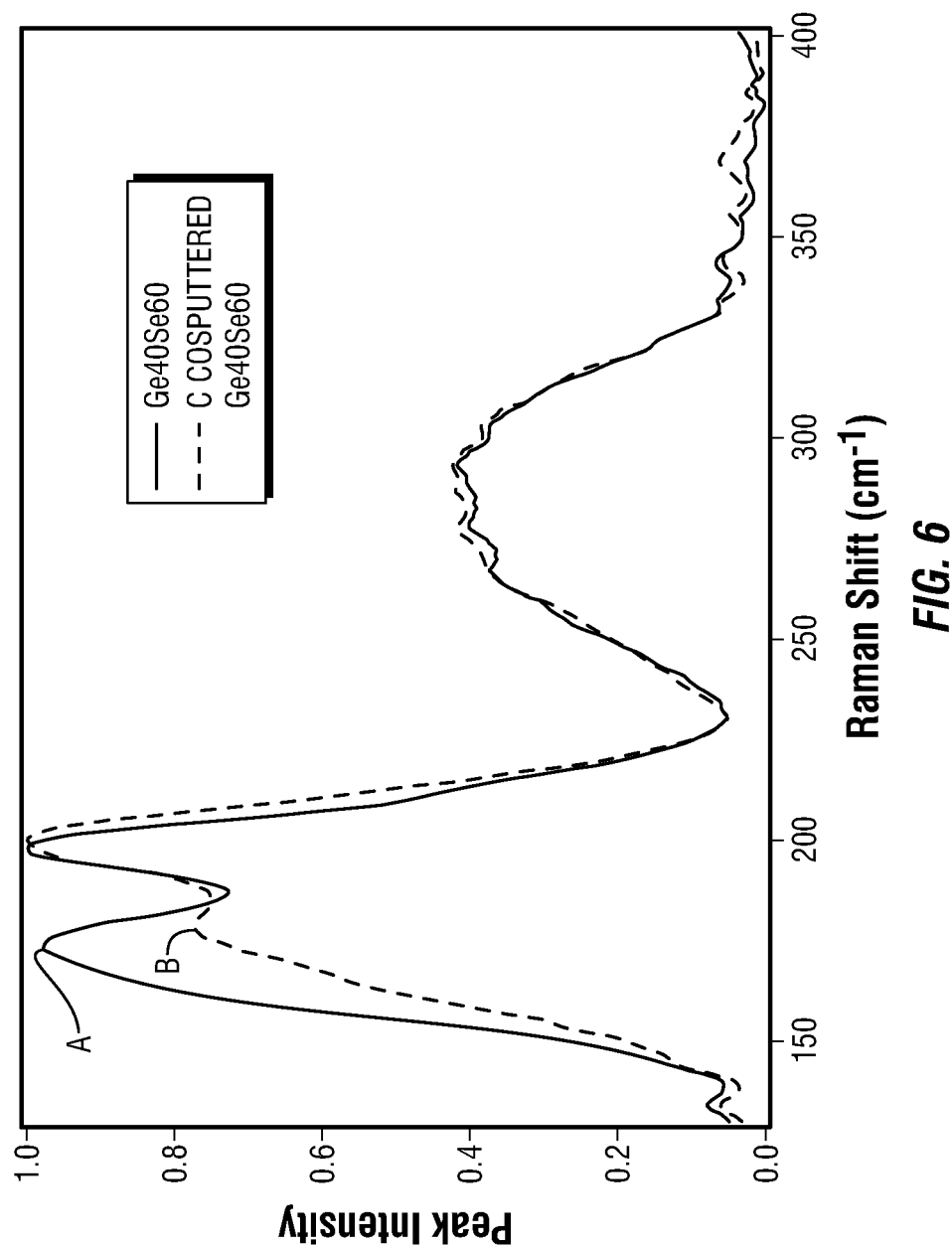
FIG. 6 illustrates the differences between the Raman spectra of the carbon doped Ge40Se60 and the control Ge40Se60 films.

The chart illustrated in FIG. 6 shows a comparison of the Raman spectrums of thin film of $Ge_{40}Se_{60}$ and a thin film of $Ge_{40}Se_{60}$ sputtered with carbon. The Raman spectrum is determined by use of vibrational molecular spectroscopy in which a laser photon is scattered by a sample molecule and thus, loses (or gains) energy during the process. The amount of energy lost is characteristic of a particular bond. The first peaks shown on the chart, peak "A" for $Ge_{40}Se_{60}$ and peak "B" for $Ge_{40}Se_{60}$ sputtered with carbon, correspond to the Ge—Ge bond. It is believed that the Ge—Ge bond is critical to proper functioning of memristor devices. Since peak "B" is lower than peak "A", FIG. 6 illustrates that the carbon has been incorporated into the $Ge_{40}Se_{60}$ film thus displacing some of the Ge—Ge bonds in the $Ge_{40}Se_{60}$ film. Thus, the performance of a memristor device 100 that comprises a $Ge_{40}Se_{60}$ film sputtered with carbon will differ from conventional memristor devices.

Figure 7:
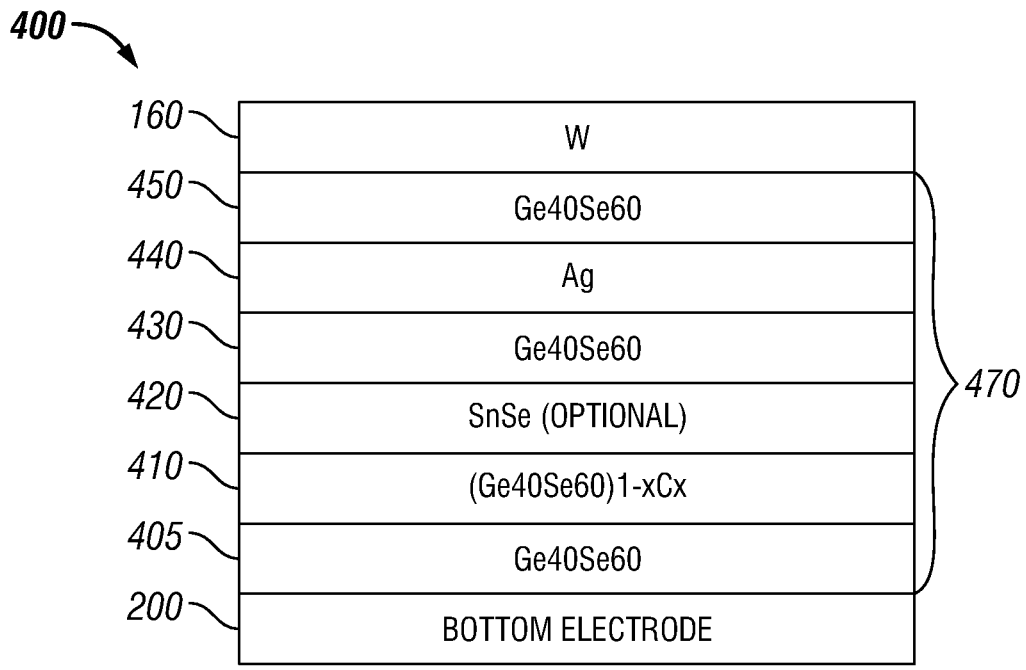
FIG. 7 illustrates one embodiment of a memristor film stack with a carbide active layer.

FIG. 7 illustrates one example of a memristor device 400 with a first chalcogenide layer that is incorporated with carbon 410. In the illustrated example, the first chalcogenide layer 410 of the memristor device may have a thickness within the range of about 100 angstroms (A) to about 800 Å. The first chalcogenide layer 410 may comprise $(Ge_{40}Se_{60})_{(1-x)}C_x$. In some embodiments it may be desirable to have an x value in the range of $0.1 \leq x \leq 0.5$. The addition of carbon to the chalcogenide layers permits the tuning of the resistance of the memristor device 400. As discussed above, carbon is usually considered an impurity in the semiconductor manufacturing industry and is thus not incorporated into prior continuously variable resistance devices.

As also shown, the first chalcogenide layer 410 of the memristor device 400 may be formed layer of a lower chalcogenide layer 405. For example, in some embodiments, the lower chalcogenide layer 405 may comprise $Ge_{40}Se_{60}$ and have a thickness within the range of about 100 Å to about 150 Å. Other embodiments are also possible. The lower chalcogenide layer 405 is positioned on a bottom electrode layer 200. In some embodiments bottom electrode layer 200 may comprise a silver layer. Other layers are also possible. In some embodiments bottom electrode layer 200 may be formed on a substrate layer (not shown in FIG. 7).

Some embodiments of memristor device 400 further comprise an optional metallic layer 420. For example, some embodiments may comprise an optional metallic layer 420 of SnSe and having a thickness within the range of about 500 Å to about 1000 Å. A SnSe layer 420 may provide certain advantages. For example, a sputtered SnSe layer is crystalline, which may promote the migration of silver through the layer. Silver may react with the layer 420 to form silver-selenide, which may be desirable for good switching characteristics of the device 400.

Some embodiments of the memristor device 400 further comprise a second chalcogenide layer 430. For example, in some embodiments, the second chalcogenide layer 430 may comprise $Ge_{40}Se_{60}$ and have a thickness within the range of about 100 Å to about 150 Å. Other embodiments are also possible.

Embodiments of the memristor device 400 further comprises a second metallic layer 440, which provides a source of mobile ions. In some embodiments, the second metallic layer 440 may comprise Ag and may have a thickness within the range of about 500 Å to about 800 Å. In some embodiments, the second metallic layer 440 may comprise Cu. The second metallic layer 440 may be deposited by any technique known in the art.

Some embodiments of the memristor device 400 may further comprise a third chalcogenide layer 450. For example, embodiments of the third chalcogenide layer 450 may comprise $Ge_{40}Se_{60}$ and have a thickness within the range of about 100 Å to about 150 Å. Generally, layers 405 through 450 may be referred to as the chalcogenide stack 470.

Some embodiments of the memristor device 400 further comprise a top electrode layer 160. The top electrode layer 160 may comprise any suitable electrode material (e.g., tungsten) and may have a thickness within the range of about 350 Å to about 400 Å.

Figure 8:
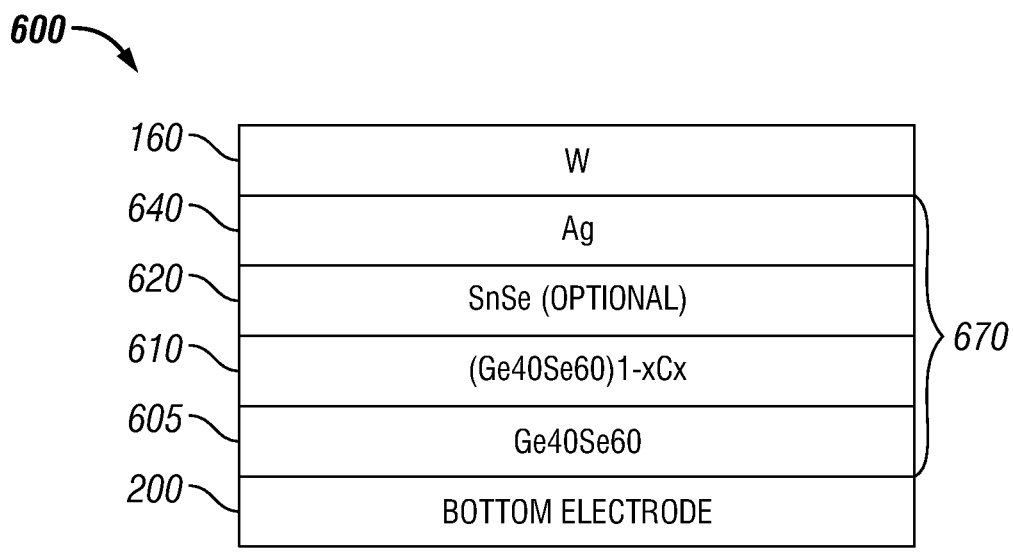
FIG. 8 illustrates one embodiment of a memristor film stack with a carbide active layer.

FIG. 8 illustrates one example of a memristor device 600 with a first chalcogenide layer that is incorporated with carbon 610. In the illustrated example, the first chalcogenide layer 610 of the memristor device may have a thickness within the range of about 100 angstroms (A) to about 800 Å. The first chalcogenide layer 610 may comprise $(Ge_{40}Se_{60})_{(1-x)}C_x$. In some embodiments it may be desirable to have an x value in the range of $0.1 \leq x \leq 0.5$. The addition of carbon to the chalcogenide layers permits the tuning of the resistance of the memristor device 600. As discussed above, carbon is usually considered an impurity in the semiconductor manufacturing industry and is thus not incorporated into prior continuously variable resistance devices.

As also shown, the first chalcogenide layer 610 of the memristor device 600 may be formed layer of a lower chalcogenide layer 605. For example, in some embodiments, the lower chalcogenide layer 605 may comprise $Ge_{40}Se_{60}$ and have a thickness within the range of about 100 Å to about 150 Å. Other embodiments are also possible. The lower chalcogenide layer 605 is positioned on a bottom electrode layer 200. In some embodiments bottom electrode layer 200 may comprise a silver layer. Other layers are also possible. In some embodiments bottom electrode layer 200 may be formed on a substrate layer (not shown in FIG. 8).

Some embodiments of memristor device 600 further comprise an optional metallic layer 620. For example, some embodiments may comprise an optional metallic layer 620 of SnSe and having a thickness within the range of about 500 Å to about 1000 Å. A SnSe layer 620 may provide certain advantages. For example, a sputtered SnSe layer is crystalline, which may promote the migration of silver through the layer. Silver may react with the layer 620 to form silver-selenide, which may be desirable for good switching characteristics of the device 600.

Embodiments of the memristor device 600 further comprises a second metallic layer 640, which provides a source of mobile ions. In some embodiments, the second metallic layer 640 may comprise Ag and may have a thickness within the range of about 500 Å to about 800 Å. In some embodiments, the second metallic layer 640 may comprise Cu. The second metallic layer 640 may be deposited by any technique known in the art. Generally, layers 605 through 640 may be referred to as the chalcogenide stack 670. Some embodiments of the memristor device 600 further comprise a top electrode layer 160. The top electrode layer 160 may comprise any suitable electrode material (e.g., tungsten) and may have a thickness within the range of about 350 Å to about 600 Å.

Figure 9:
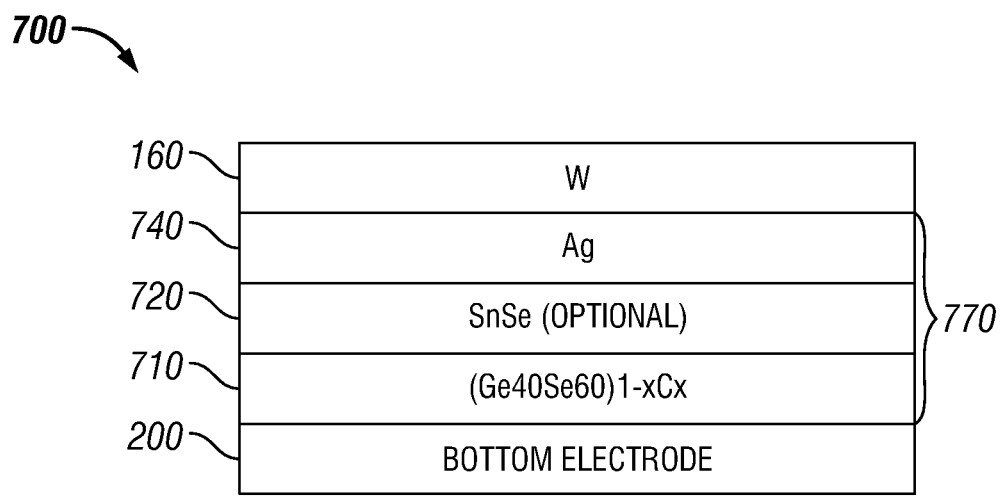
FIG. 9 illustrates one embodiment of a memristor film stack with a carbide active layer.

FIG. 9 illustrates one example of a memristor device 700 with a chalcogenide layer that is incorporated with carbon 710. In the illustrated example, the chalcogenide layer 710 of the memristor device 700 may have a thickness within the range of about 100 angstroms (Å) to about 800 Å. The chalcogenide layer 710 may comprise $(Ge_{40}Se_{60})_{(1-x)}C_x$. In some embodiments it may be desirable to have an x value in the range of $0.1 \leq x \leq 0.5$. The addition of carbon to the chalcogenide layers permits the tuning of the resistance of the memristor device 700. As discussed above, carbon is usually considered an impurity in the semiconductor manufacturing industry and is thus not incorporated into prior continuously variable resistances devices.

Some embodiments of memristor device 700 further comprise an optional metallic layer 720. For example, some embodiments may comprise an optional metallic layer 720 of SnSe and having a thickness within the range of about 500 Å to about 1000 Å. A SnSe layer 720 may provide certain advantages. For example, a sputtered SnSe layer is crystalline, which may promote the migration of silver through the layer. Silver may react with the layer 720 to form silver-selenide, which may be desirable for good switching characteristics of the device 700.

Embodiments of the memristor device 700 further comprises a second metallic layer 740, which provides a source of mobile ions. In some embodiments, the second metallic layer 740 may comprise Ag and may have a thickness within the range of about 500 Å to about 800 Å. In some embodiments, the second metallic layer 740 may comprise Cu. The second metallic layer 740 may be deposited by any technique known in the art. Generally, layers 710 through 740 may be referred to as the chalcogenide stack 770. Some embodiments of the memristor device 700 further comprise a top electrode layer 160. The top electrode layer 160 may comprise any suitable electrode material (e.g., tungsten) and may have a thickness within the range of about 350 Å to about 400 Å.

Although various embodiments have been shown and described, the present disclosure is not so limited and will be understood to include all such modifications and variations as would be apparent to one skilled in the art.

What is claimed is:

1. A variable resistance memory device comprising:
   a first electrode;
   a second electrode;
   a first chalcogenide material layer between the first and second electrodes, the chalcogenide layer comprising carbon incorporated into germanium selenide chalcogenide glass;
   a second chalcogenide material layer between the first chalcogenide material layer and the second electrode;
   a first metallic layer between the second chalcogenide material layer and the second electrode; and
   a third chalcogenide material layer between the first metallic layer and the second electrode.

2. The device of claim 1, further comprising a fourth chalcogenide material layer between the first chalcogenide material layer and the first electrode.

3. The device of claim 1, wherein the first chalcogenide material layer further comprises $(Ge_{40}Se_{60})_{(1-x)}C_x$.

4. The device of claim of claim 3, wherein x has a range of approximately 0.1 to 0.5.

5. The device of claim 1, wherein the first chalcogenide material layer comprises carbon co-sputtered with $Ge_{40}Se_{60}$.

6. The device of claim 5, further comprising a second metallic layer between the first chalcogenide material layer and the second chalcogenide material layer.

7. The device of claim 6, further comprising a fourth chalcogenide material layer between the first chalcogenide material layer and the first electrode.

8. The device of claim 7, wherein the second metallic layer comprises tin selenide.

9. The device of claim 8, wherein the second metallic layer has a thickness ranging between approximately 500 angstroms and 1000 angstroms.

10. The device of claim 5, wherein the second electrode comprises a layer of tungsten.

11. The device of claim 10, wherein the first metallic layer comprises silver.

12. The device of claim 11, wherein the first chalcogenide material layer has a thickness between approximately 100 and 800 angstroms, the second metallic layer has a thickness between approximately 500 angstroms and 1000 angstroms, the second chalcogenide material layer has a thickness between approximately 100 and 150 angstroms, the first metallic layer has a thickness between approximately 500 and 800 angstroms, the third chalcogenide material layer has a thickness between approximately 100 and 150 angstroms, and the second electrode has a thickness between approximately 350 and 400 angstroms.

13. A method of forming a variable resistance memory device comprising:
   forming a first electrode;
   forming a second electrode;
   forming a first chalcogenide material layer between the first and second electrodes, the chalcogenide layer comprising carbon incorporated into germanium selenide chalcogenide glass;
   forming a second chalcogenide material layer between the first chalcogenide material layer and the second electrode;
   forming a first metallic layer between the second chalcogenide material layer and the second electrode; and
   forming a third chalcogenide material layer between the first metallic layer and the second electrode.

14. The method of claim 13, further comprising forming a second metallic layer between the first chalcogenide material layer and the second chalcogenide material layer.

15. The method of claim 14, wherein first metallic layer comprises silver and the second metallic layer comprises tin selenide.

16. The method of claim 13, wherein forming the first chalcogenide material layer further comprises co-sputtering carbon and $Ge_{40}Se_{60}$ to form the first chalcogenide material layer.

17. The method of claim 16, wherein co-sputtering carbon and $Ge_{40}Se_{60}$ further comprises co-sputtering with a power of 50 watts.

18. A method of forming a variable resistance memory device comprising:
   forming a first electrode on a substrate;
   forming a chalcogenide stack on the first electrode, the chalcogenide stack comprising a layer of carbon incorporated into germanium selenide chalcogenide glass; and
   forming a second electrode on the chalcogenide stack.

19. The method claim 18, further comprising forming an insulating layer adjacent to first electrode.

20. The method of claim 19, wherein the insulating layer is silicon nitride.

21. The method of claim 18, further comprising co-sputtering carbon with $Ge_{40}Se_{60}$ to form the layer of carbon incorporated into germanium selenide chalcogenide glass of the chalcogenide stack.

22. The method of claim 21, wherein the carbon and $Ge_{40}Se_{60}$ are co-sputtered using a power of 50 watts.

23. A variable resistance memory device comprising:
   a first electrode;
   a second electrode;
   a first chalcogenide material layer between the first and second electrodes, the chalcogenide layer comprising carbon incorporated into germanium selenide chalcogenide glass; and
   a first metallic layer between the first chalcogenide material layer and the second electrode.

24. The device of claim 23, further comprising a second metallic layer between the first chalcogenide material layer and the first metallic layer.

25. The device of claim 23, further comprising a second chalcogenide material layer between the first chalcogenide material layer and the first electrode.

26. The device of claim 25, further comprising a second metallic layer between the first chalcogenide material layer and the first metallic layer.

* * * * *